(12) United States Patent
Huang

(10) Patent No.: US 11,664,341 B2
(45) Date of Patent: May 30, 2023

(54) METHOD FOR PREPARING SEMICONDUCTOR DEVICE WITH COMPOSITE DIELECTRIC STRUCTURE

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 72 days.

(21) Appl. No.: 17/533,437

(22) Filed: Nov. 23, 2021

(65) Prior Publication Data
US 2022/0084976 A1 Mar. 17, 2022

Related U.S. Application Data

(62) Division of application No. 16/823,489, filed on Mar. 19, 2020, now Pat. No. 11,264,350.

(51) Int. Cl.
*H01L 23/00* (2006.01)

(52) U.S. Cl.
CPC .............. *H01L 24/32* (2013.01); *H01L 24/27* (2013.01); *H01L 2224/26125* (2013.01); *H01L 2224/27622* (2013.01); *H01L 2224/32057* (2013.01); *H01L 2224/32145* (2013.01)

(58) Field of Classification Search
CPC . H01L 25/043; H01L 25/0657; H01L 25/074; H01L 25/0756; H01L 25/117; H01L 2225/06503–06596; H01L 2224/32145; H01L 24/27–33; H01L 2224/32057; H01L 2224/27622
See application file for complete search history.

(56) References Cited

U.S. PATENT DOCUMENTS

| 2010/0038802 A1* | 2/2010 | Chen ..................... H01L 24/30 257/777 |
| 2018/0145046 A1 | 5/2018 | Lo et al. |
| 2019/0067358 A1 | 2/2019 | Lin et al. |
| 2020/0006266 A1 | 1/2020 | Chen et al. |

FOREIGN PATENT DOCUMENTS

| TW | 201448115 A | 12/2014 |
| TW | 201644054 A | 12/2016 |
| TW | 201810749 A | 3/2018 |
| TW | 201830578 A | 8/2018 |

* cited by examiner

*Primary Examiner* — Tucker J Wright
(74) *Attorney, Agent, or Firm* — Xuan Zhang

(57) ABSTRACT

The present disclosure provides a method for preparing a semiconductor device with a composite dielectric structure. The method includes forming a photoresist pattern structure over a first semiconductor die. The method also includes forming a second dielectric layer surrounding the photoresist pattern structure, and removing the photoresist pattern structure to form a first opening in the second dielectric layer. The method further includes forming dielectric spacers along sidewalls of the first opening, and forming an interconnect structure surrounded by the dielectric spacers. In addition, the method includes bonding a second semiconductor die to the second dielectric layer. The second semiconductor die includes a second conductive pad facing the interconnect structure, and the second conductive pad is electrically connected to the first conductive pad of the first semiconductor die through the interconnect structure.

7 Claims, 17 Drawing Sheets

METHOD FOR PREPARING SEMICONDUCTOR DEVICE WITH COMPOSITE DIELECTRIC STRUCTURE

CROSS-REFERENCE TO RELATED APPLICATION

This application is a divisional application of U.S. Non-Provisional application Ser. No. 16/823,489 filed Mar. 19, 2020, which is incorporated herein by reference in its entirety.

TECHNICAL FIELD

The present disclosure relates to a method for preparing a semiconductor device, and more particularly, to a method for preparing a semiconductor device with a composite dielectric structure.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies, such as an increase in parasitic capacitance between adjacent interconnect structures. Accordingly, there is a continuous need to improve the manufacturing process of semiconductor devices so that the deficiencies can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes an interconnect structure disposed over a first semiconductor die. The first semiconductor die includes a semiconductor substrate and a first conductive pad disposed over the semiconductor substrate, and the first conductive pad is covered by the interconnect structure. The semiconductor device also includes dielectric spacers surrounding the interconnect structure. An interface between the dielectric spacers and the interconnect structure is curved. The semiconductor device further includes a dielectric layer surrounding the dielectric spacers, and a second semiconductor die bonded to the dielectric layer and the interconnect structure. The second semiconductor die includes a second conductive pad, and the interconnect structure is covered by the second conductive pad.

In an embodiment, the dielectric spacers and the dielectric layer are made of different materials. In an embodiment, a top width of the interconnect structure is greater than a bottom width of the interconnect structure. In an embodiment, the semiconductor device further includes a dielectric structure penetrating through the dielectric layer, wherein a material of the dielectric structure is the same as a material of the dielectric spacers. In an embodiment, the semiconductor device further includes a dielectric lining layer disposed between the first semiconductor die and the dielectric layer, wherein the dielectric lining layer is partially covered by the dielectric spacers. In an embodiment, the interconnect structure is in direct contact with the dielectric lining layer and the first conductive pad. In an embodiment, the dielectric spacers and the dielectric lining layer are made of different materials.

In another embodiment of the present disclosure, a semiconductor device is provided. The semiconductor device includes a first dielectric layer disposed over a first semiconductor substrate, and a first conductive pad embedded in the first dielectric layer. The semiconductor device also includes a dielectric lining layer disposed over the first dielectric layer, and a second dielectric layer disposed over the dielectric lining layer. The semiconductor device further includes an interconnect structure penetrating through the second dielectric layer and the dielectric lining layer, and a dielectric spacer disposed between the interconnect structure and the second dielectric layer. In addition, the semiconductor device includes a second semiconductor substrate disposed over the second dielectric layer. A second conductive pad in the second semiconductor substrate is electrically connected to the first conductive pad through the interconnect structure.

In an embodiment, the interconnect structure has curved sidewalls, and a top width of the interconnect structure is greater than a bottom width of the interconnect structure. In an embodiment, the dielectric lining layer and the second dielectric layer are made of different materials. In an embodiment, the semiconductor device further includes a dielectric structure disposed in the second dielectric layer and separated from the dielectric spacer, wherein the dielectric structure and the dielectric spacer are disposed over the dielectric lining layer. In an embodiment, a material of the dielectric structure is the same as a material of the dielectric spacer, and a width of the dielectric structure is greater than a bottom width of the dielectric spacer. In an embodiment, the interconnect structure further includes a conductive structure, and a conductive liner surrounding the conductive structure, wherein the conductive structure is separated from the first conductive pad and the dielectric spacer by the conductive liner.

In yet another embodiment of the present disclosure, a method for preparing a semiconductor device is provided. The method includes forming a photoresist pattern structure over a first semiconductor die. The first semiconductor die includes a first dielectric layer and a first conductive pad in the first dielectric layer, and the first conductive pad is covered by the photoresist pattern structure. The method also includes forming a second dielectric layer surrounding the photoresist pattern structure, and removing the photoresist pattern structure to form a first opening in the second dielectric layer. The method further includes forming dielectric spacers along sidewalls of the first opening, and forming an interconnect structure surrounded by the dielectric spacers. In addition, the method includes bonding a second semiconductor die to the second dielectric layer. The second semiconductor die includes a second conductive pad facing the interconnect structure, and the second conductive pad is electrically connected to the first conductive pad of the first semiconductor die through the interconnect structure.

In an embodiment, the photoresist pattern structure includes a first portion and a second portion, the first portion of the photoresist pattern structure is removed to form the first opening in the second dielectric layer, and the second portion of the photoresist pattern structure is removed to form a second opening in the second dielectric layer, wherein a width of the first opening is greater than a width of the second opening. In an embodiment, the method further includes depositing a third dielectric layer over the second dielectric layer after the photoresist pattern structure is removed, wherein the first opening is partially filled by the third dielectric layer while the second opening is entirely filled by the third dielectric layer. In an embodiment, the method further includes performing a first dry etching process on the third dielectric layer such that the dielectric spacers are formed in the first opening, and the second opening is filled by a dielectric structure, wherein the dielectric structure is wider than each of the dielectric spacers. In an embodiment, the method further includes forming a dielectric lining layer over the first dielectric layer before the photoresist pattern structure is formed, wherein the first conductive pad is covered by the dielectric lining layer. In an embodiment, the method further includes performing a second dry etching process on the dielectric lining layer using the dielectric spacers as a mask, such that the first conductive pad is exposed in the first opening before the interconnect structure is formed. In an embodiment, the step of forming the interconnect structure includes forming a conductive lining layer over the second dielectric layer, the dielectric spacers and the first conductive pad. The step of forming the interconnect structure also includes forming a conductive layer over the conductive lining layer, and polishing the conductive lining layer and the conductive layer to expose the second dielectric layer and the dielectric spacers.

Embodiments of a semiconductor device are provided in the disclosure. The semiconductor device includes dielectric spacers surrounding an interconnect structure, and a dielectric layer surrounding the dielectric spacers. The dielectric spacers and the dielectric layer form a composite dielectric structure to reduce the parasitic capacitance between the interconnect structure and other nearby interconnect structures and wiring.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
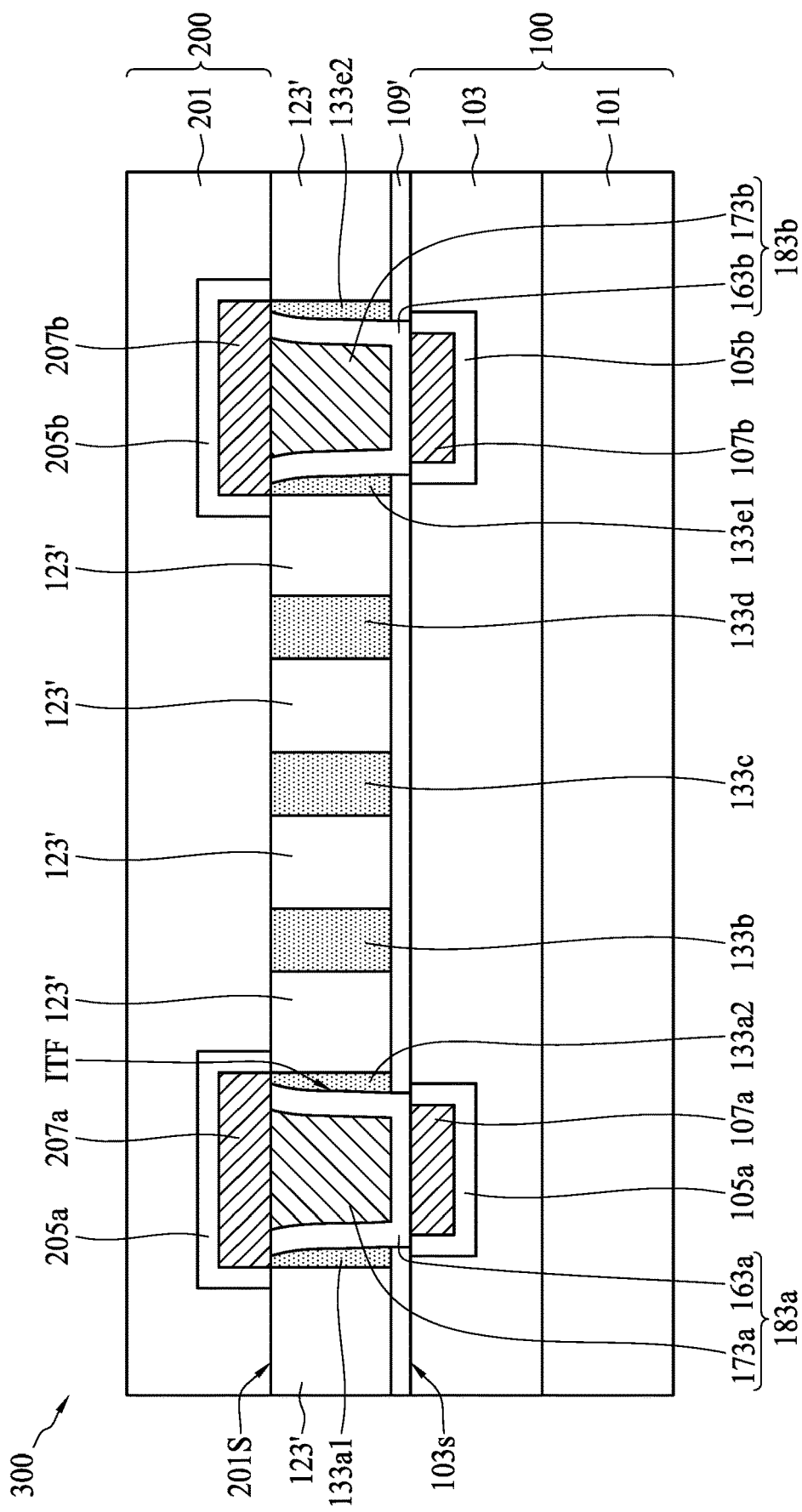
FIG. 1 is a cross-sectional view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device 300, in accordance with some embodiments. As shown in FIG. 1, the semiconductor device 300 includes a first semiconductor die 100, a second semiconductor die 200, and a dielectric layer 123' disposed between the first semiconductor die 100 and the second semiconductor die 200, in accordance with some embodiments.

In some embodiments, the first semiconductor die 100 includes a semiconductor substrate 101, a dielectric layer 103 disposed over the semiconductor substrate 101, and conductive pads 107a, 107b embedded in the dielectric layer 103. Specifically, the first semiconductor die 100 further includes conductive liners 105a, 105b disposed between the conductive pads 107a, 107b and the dielectric layer 103. It should be noted that the conductive pads 107a, 107b are located close to a surface 103S of the dielectric layer 103 facing the second semiconductor die 200, and the conductive pads 107a, 107b are exposed at the surface 103S, in accordance with some embodiments.

In some embodiments, the second semiconductor die 200 includes a semiconductor substrate 201, and conductive pads 207a, 207b in the semiconductor substrate 201. Specifically, the second semiconductor die 200 further includes conductive liners 205a, 205b disposed between the conductive pads 207a, 207b and the semiconductor substrate 201. It should be noted that the conductive pads 207a, 207b are located close to a surface 201S of the semiconductor substrate 201 facing the first semiconductor die 100, and the conductive pads 207a, 207b are exposed at the surface 201S, in accordance with some embodiments.

In some embodiments, a dielectric lining layer 109' is disposed over the dielectric layer 103, and the dielectric layer 123' is disposed over the dielectric lining layer 109'. In some embodiments, the semiconductor device 300 also includes interconnect structures 183a, 183b penetrating through the dielectric layer 123' and the dielectric lining layer 109', and dielectric spacers 133a1, 133a2, 133e1, 133e2 and dielectric structures 133b, 133c, 133d penetrating through the dielectric layer 123'. In other words, the dielectric spacers 133a1, 133a2, 133e1, 133e2 and dielectric structures 133b, 133c, 133d are disposed over the dielectric lining layer 109', in accordance with some embodiments.

In some embodiments, the interconnect structure 183a is surrounded by the dielectric spacers 133a1, 133a2, the interconnect structure 183b is surrounded by the dielectric spacers 133e1, 133e2, and the dielectric structures 133b, 133c, 133d are located between the interconnect structures 183a and 183b. In some embodiments, the interconnect structure 183a is separated from the dielectric layer 123' by the dielectric spacers 133a1, 133a2, and the interconnect structure 183b is separated from the dielectric layer 123' by the dielectric spacers 133e1, 133e2. In some embodiments, the dielectric spacers 133a1, 133a2, 133e1, 133e2 and the dielectric structures 133b, 133c, 133d are surrounded by the dielectric layer 123', and the dielectric structures 133b, 133c, 133d are separate from the dielectric spacers 133a1, 133a2, 133e1, 133e2. In particular, the dielectric structures 133b, 133c, 133d are separated from each other, in accordance with some embodiments.

Specifically, the interconnect structure 183a includes a conductive structure 173a and a conductive liner 163a surrounding the conductive structure 173a, and the interconnect structure 183b includes a conductive structure 173b and a conductive liner 163b surrounding the conductive structure 173b. In some embodiments, the conductive liner 163a is disposed over the sidewalls and the bottom surface of the conductive structure 173a, and the conductive liner 163b is disposed over the sidewalls and the bottom surface of the conductive structure 173b. Accordingly, the conductive structure 173a is separated from the conductive pad 107a and the dielectric spacers 133a1, 133a2 by the conductive liner 163a, and the conductive structure 173b is separated from the conductive pad 107b and the dielectric spacers 133e1, 133e2 by the conductive liner 163b, in accordance with some embodiments.

In some embodiments, the conductive pads 107a, 107b are covered by the interconnect structures 183a, 183b, respectively. In some embodiments, the interconnect structures 183a, 183b are covered by the conductive pads 207a, 207b, respectively. In some embodiments, the interconnect structures 183a, 183b are in direct contact with the dielectric lining layer 109' and the conductive pads 107a, 107b.

Still referring to FIG. 1, the interconnect structures 183a, 183b are in direct contact with the dielectric spacers 133a1, 133a2, 133e1, 133e2. In addition, in some embodiments, the interfaces between the dielectric spacers 133a1, 133a2 and the interconnect structures 183a and the interfaces between the dielectric spacers 133e1, 133e2 and the interconnect structure 183b are curved. For example, the interface ITF between the dielectric spacer 133a2 and the interconnect structure 183a is curved. In particular, in some embodiments, the interfaces between the dielectric spacers 133a1, 133a2 and the interconnect structure 183a are convex surfaces facing the interconnect structure 183a, and the interfaces between the dielectric spacers 133e1, 133e2 and the interconnect structure 183b are convex surfaces facing the interconnect structure 183b.

Furthermore, the second semiconductor die 200 is bonded to the first semiconductor die 100 with the conductive pads 207a and 207b facing the interconnect structures 183a and 183b, respectively, over the first semiconductor die 100. In some embodiments, the first semiconductor die 100 and the second semiconductor die 200 are logic dies, system-on-chip (SoC) dies, memory dies, or other applicable dies. The memory dies may include memory devices such as static random access memory (SRAM) devices, dynamic random access memory (DRAM) devices, other suitable devices, or a combination thereof.

It should be noted that the semiconductor substrate 101 of the first semiconductor die 100 may include various devices, and the conductive pads 107a, 107b are used to electrically connect the devices in the semiconductor substrate 101 to other semiconductor dies bonded thereon, such as the second semiconductor die 200. Similarly, the semiconductor substrate 201 of the second semiconductor die 200 may include various devices, and the conductive pads 207a, 207b are used to electrically connect the devices in the semiconductor substrate 201 to other semiconductor dies. The conductive pad 207a of the second semiconductor die 200 is electrically connected to the conductive pad 107a of the first semiconductor die 100 through the interconnect structure 183a, and the conductive pad 207b of the second semiconductor die 200 is electrically connected to the conductive pad 107b of the first semiconductor die 100 through the interconnect structure 183b, as shown in FIG. 1 in accordance with some embodiments.

Figure 2:
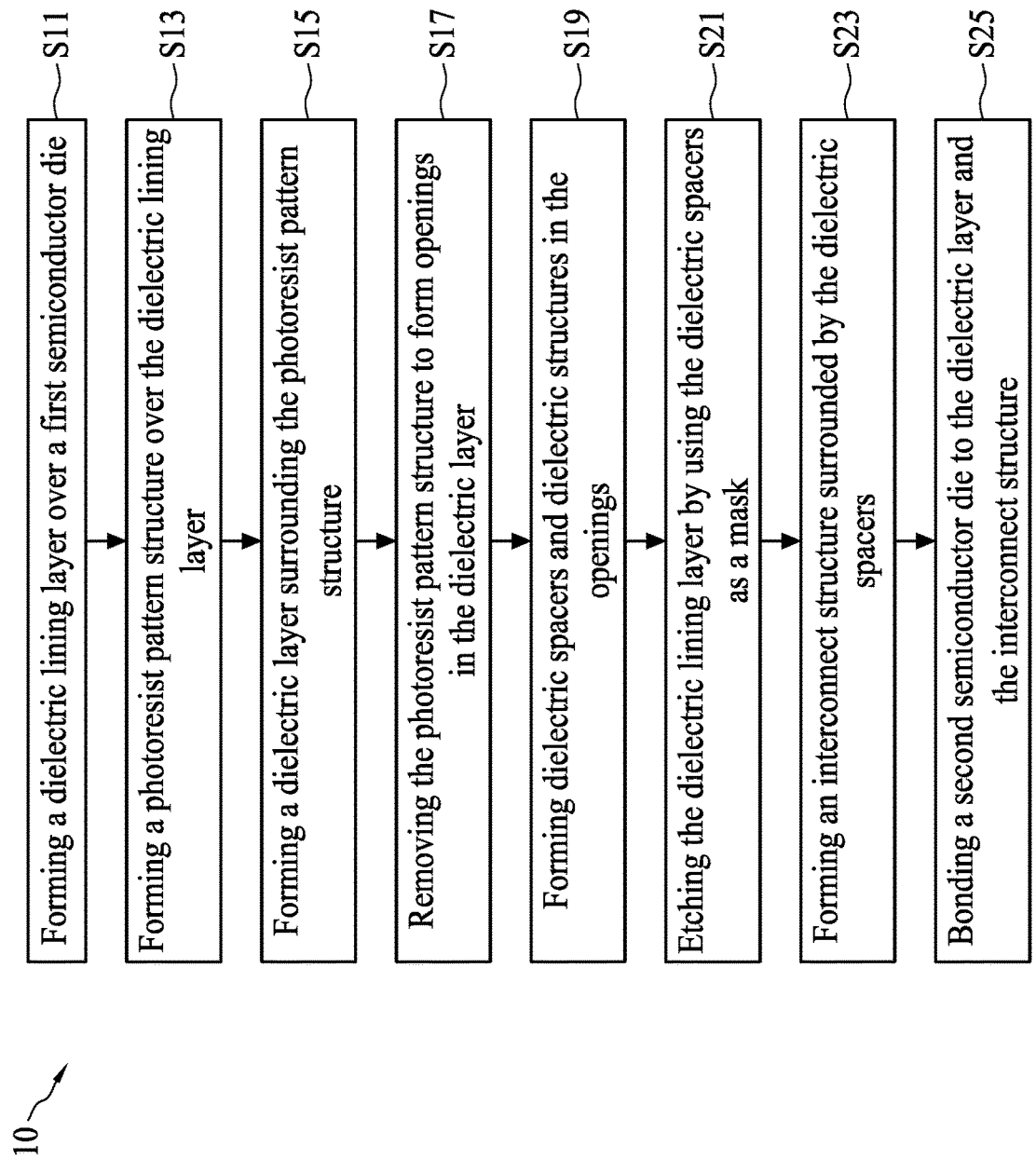
FIG. 2 is a flow diagram illustrating a method of forming a semiconductor device, in accordance with some embodiments.

FIG. 2 is a flow diagram illustrating a method 10 of forming the semiconductor device 300, and the method 10 includes steps S11, S13, S15, S17, S19, S21, S23 and S25, in accordance with some embodiments. The steps S11 to S25 of FIG. 2 are elaborated in connection with following figures.

FIGS. 3 to 16 are cross-sectional views illustrating intermediate stages in the formation of the semiconductor device 300, in accordance with some embodiments.

Figure 3:
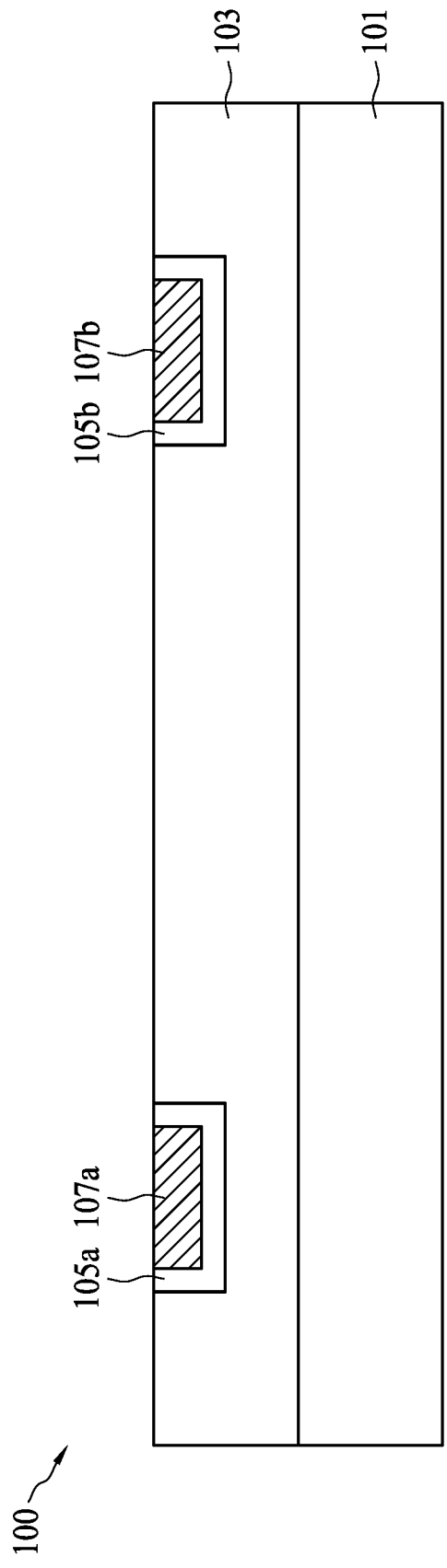
FIG. 3 is a cross-sectional view illustrating a first semiconductor die used to form the semiconductor device of FIG. 1, in accordance with some embodiments.

As shown in FIG. 3, the first semiconductor die 100 is provided. The semiconductor substrate 101 of the first semiconductor die 100 may be a portion of an integrated circuit (IC) chip that includes various passive and active microelectronic devices, such as resistors, capacitors, inductors, diodes, p-type field-effect transistors (pFETs), n-type field-effect transistors (nFETs), metal-oxide semiconductor field-effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, fin field-effect transistors (FinFETs), other suitable IC components, or combinations thereof.

Depending on the IC fabrication stage, the semiconductor substrate 101 may include various material layers (e.g., dielectric layers, semiconductor layers, and/or conductive layers) configured to form IC features (e.g., doped regions, isolation features, gate features, source/drain features, interconnect features, other features, or combinations thereof). The semiconductor substrate 101 shown in FIG. 3 has been simplified for the sake of clarity. It should be noted that additional features can be added in the semiconductor substrate 101, and some of the features described below can be replaced, modified, or eliminated in other embodiments.

In some embodiments, the first semiconductor die 100 further includes the dielectric layer 103, disposed over the semiconductor substrate 101; and the conductive liners 105a, 105b and the conductive pads 107a, 107b, disposed in the dielectric layer 103. In some embodiments, the dielectric layer 103 is made of silicon oxide, silicon carbide, silicon nitride, silicon oxynitride, another suitable material, or a combination thereof, and the dielectric layer 103 is formed by a deposition process, such as a chemical vapor deposition (CVD) process, a physical vapor deposition (PVD) process, a spin-coating process, or another suitable process.

The conductive liners 105a, 105b may be configured to separate the conductive pads 107a, 107b from the dielectric layer 103. For example, the conductive liners 105a, 105b may be made of Ta, TaN, Ti, TiN, CoW, another suitable material, or a combination thereof. The conductive pads 107a, 107b may be made of a conductive material, such as Cu, Al, W, another suitable material, or a combination thereof. In some embodiments, the conductive liners 105a, 105b and the conductive pads 107a, 107b are formed by deposition processes using CVD, PVD, atomic layer deposition (ALD), electroplating, electroless plating, sputtering, or other suitable deposition methods, and a subsequent planarization process (e.g., a chemical mechanical polishing (CMP) process, an etch back process, or a grinding process).

Figure 4:
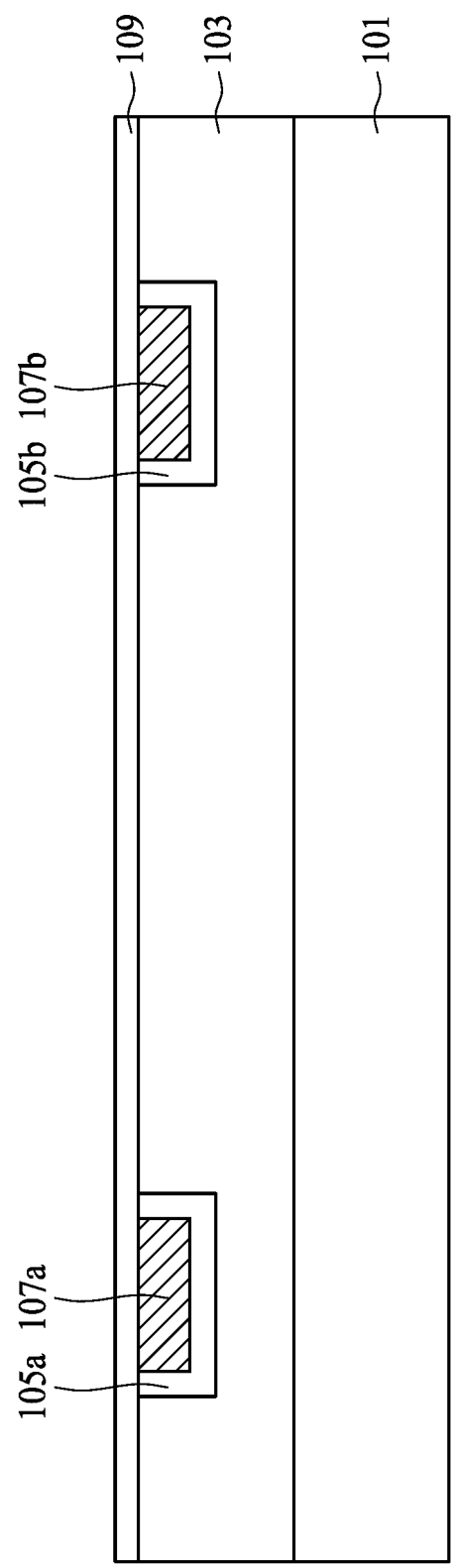
FIG. 4 is a cross-sectional view illustrating an intermediate stage of forming a dielectric lining layer during the formation of the semiconductor device, in accordance with some embodiments.

As shown in FIG. 4, a dielectric lining layer 109 is formed over the first semiconductor die 100, in accordance with some embodiments. It should be noted that the conductive pads 107a, 107b are covered by the dielectric lining layer 109, in accordance with some embodiments. The respective step is illustrated as the step S11 in the method 10 shown in FIG. 2.

In some embodiments, the dielectric lining layer 109 is made of nitride. In some other embodiments, the dielectric lining layer 109 is made of silicon nitride, silicon oxynitride, silicon carbonitride, or another suitable material. In some embodiments, the dielectric lining layer 109 is formed by a deposition process, such as a CVD process, a PVD process, an ALD process, a spin-coating process, or a combination thereof.

Figure 5:
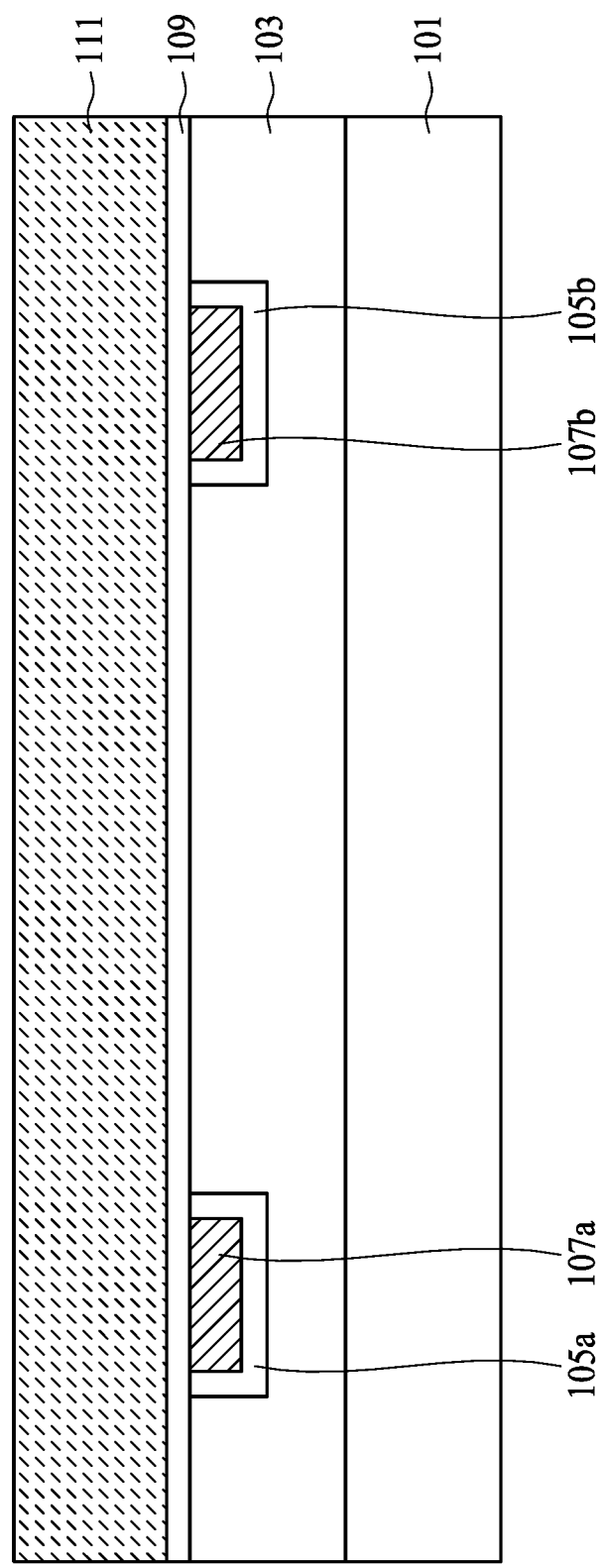
FIG. 5 is a cross-sectional view illustrating an intermediate stage of forming a photoresist layer during the formation of the semiconductor device, in accordance with some embodiments.

Next, a photoresist layer 111 is formed over the dielectric lining layer 109, as shown in FIG. 5 in accordance with some embodiments. The photoresist layer 111 may be made of a mixture of photoactive compounds, and the material of the photoresist layer 111 may be a positive or negative photoresist material. In addition, the photoresist layer 111 may be formed by a spin-coating process.

Figure 6:
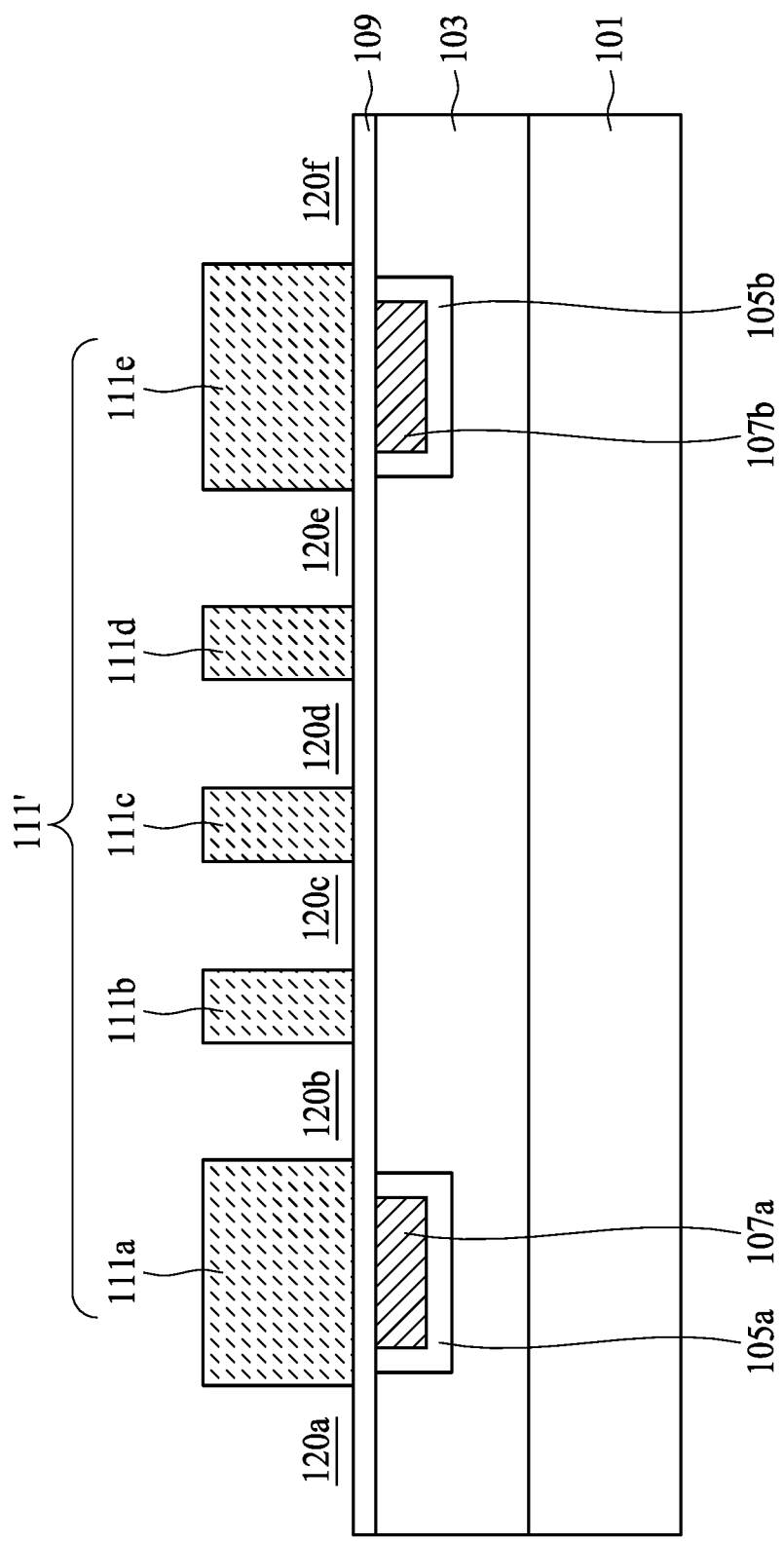
FIG. 6 is a cross-sectional view illustrating an intermediate stage of forming a photoresist pattern structure during the formation of the semiconductor device, in accordance with some embodiments.

The photoresist layer 111 is patterned to form a photoresist pattern structure 111' over the dielectric lining layer 109, as shown in FIG. 6 in accordance with some embodiments. In some embodiments, the photoresist pattern structure 111' includes a plurality of portions 111a, 111b, 111c, 111d, 111e, and openings 120a, 120b, 120c, 120d, 120e, 120f are formed among the portions 111a, 111b, 111c, 111d, 111e. The respective step is illustrated as the step S13 in the method 10 shown in FIG. 2.

Figure 7:
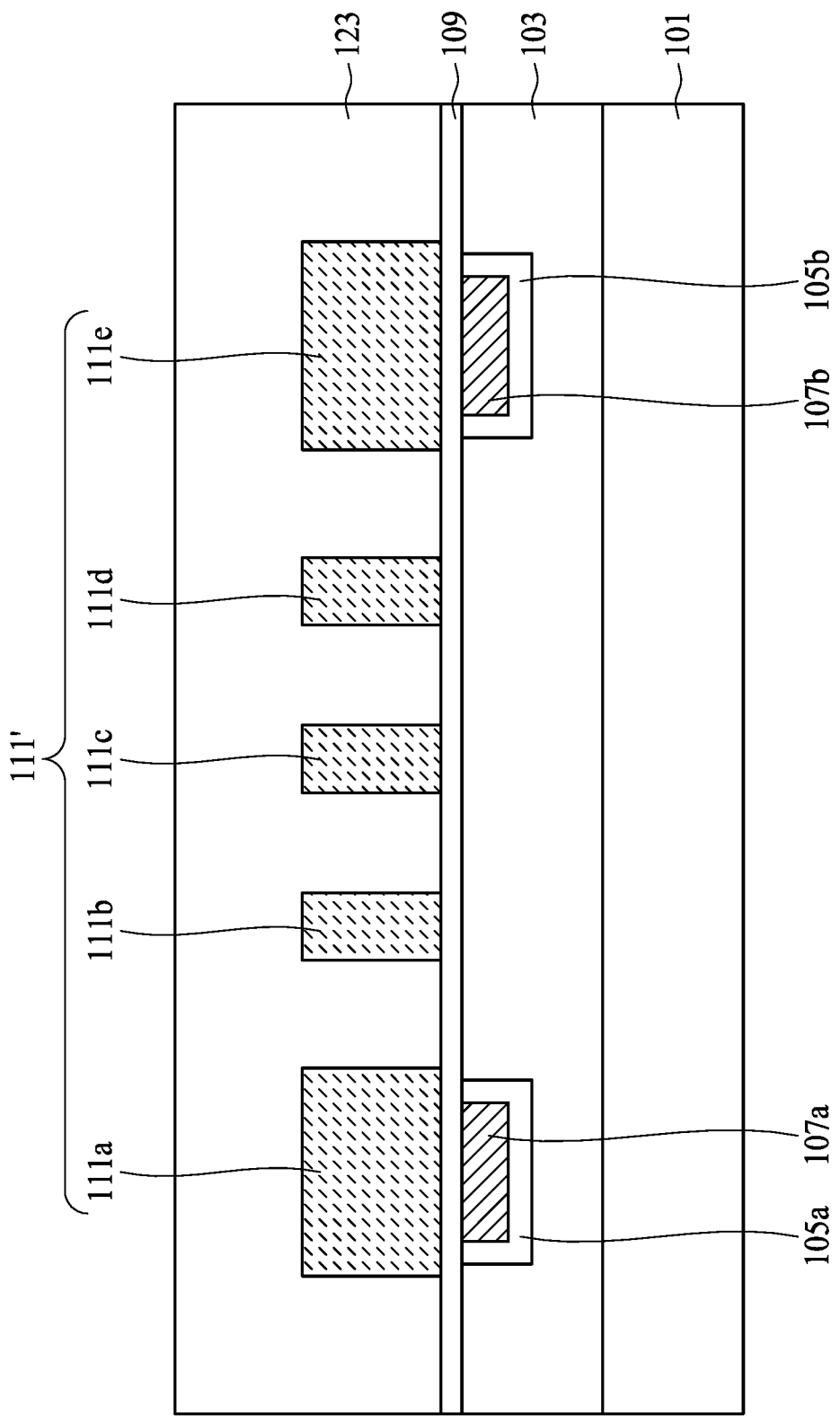
FIG. 7 is a cross-sectional view illustrating an intermediate stage of forming a dielectric material during the formation of the semiconductor device, in accordance with some embodiments.

Next, a dielectric material 123 is formed over the dielectric lining layer 109 and the photoresist pattern structure 111', as shown in FIG. 7 in accordance with some embodiments. In some embodiments, the openings 120a, 120b, 120c, 120d, 120e, 120f are completely filled by the dielectric material 123.

In some embodiments, the dielectric material 123 is made of a low-temperature oxide, such as tetraethoxysilane (TEOS) oxide. The low-temperature oxide is a low thermal budget oxide, which refers to oxides capable of being formed with a thermal budget of less than about 600° C. In some embodiments, the dielectric material 123 and the dielectric lining layer 109 are made of different materials. Moreover, the dielectric material 123 may be formed by a deposition process, such as a CVD process, a plasma-enhanced chemical vapor deposition (PECVD) process, a low-pressure chemical vapor deposition (LPCVD) process, or another suitable process.

Figure 8:
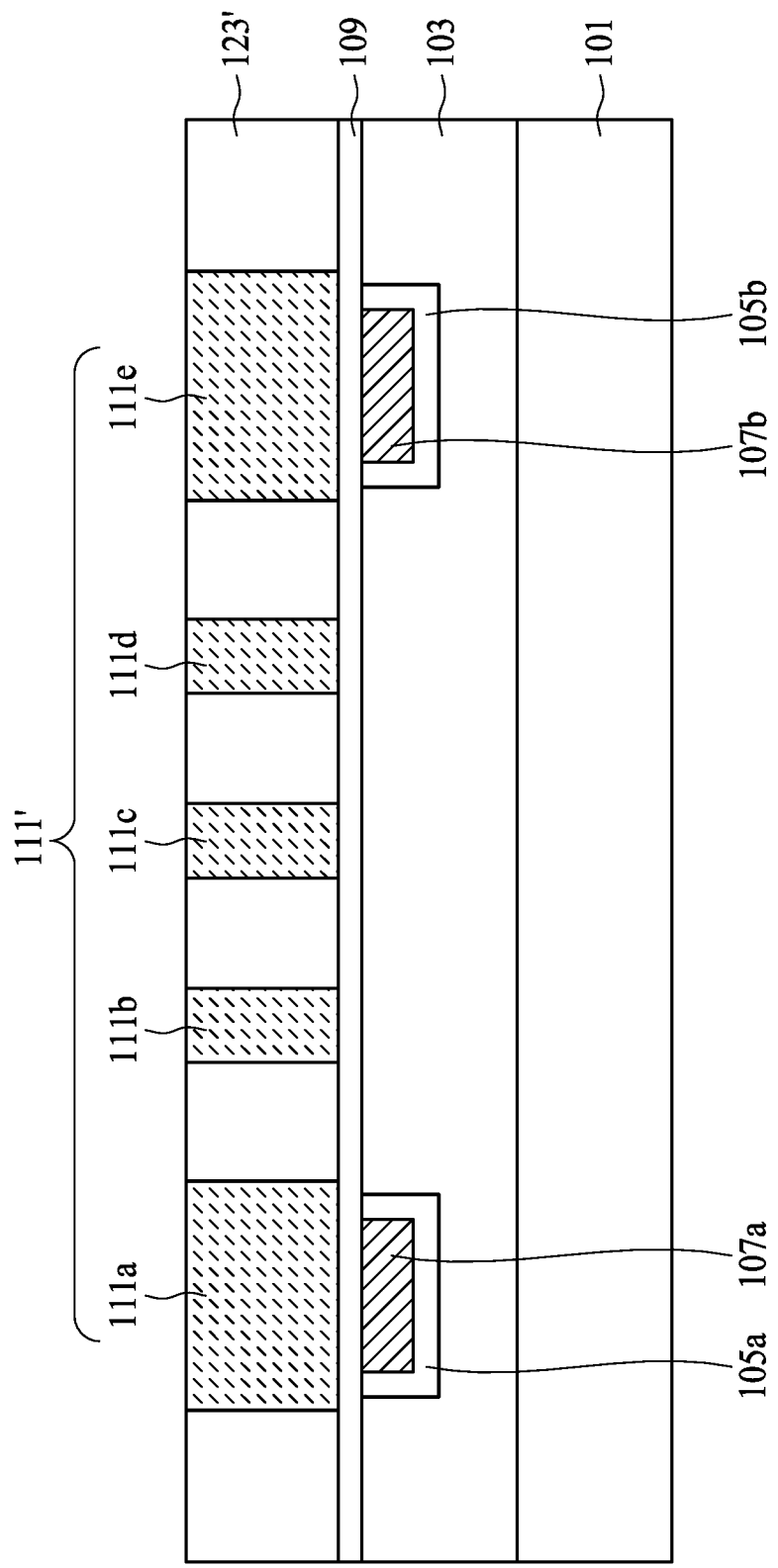
FIG. 8 is a cross-sectional view illustrating an intermediate stage of forming a dielectric layer during the formation of the semiconductor device, in accordance with some embodiments.

An etch-back process is performed on the structure of FIG. 7 until the photoresist pattern structure 111' is exposed, as shown in FIG. 8 in accordance with some embodiments. After the etch-back process, the photoresist pattern structure 111' is surrounded by the dielectric layer 123'. The respective step is illustrated as the step S15 in the method 10 shown in FIG. 2.

Figure 9:
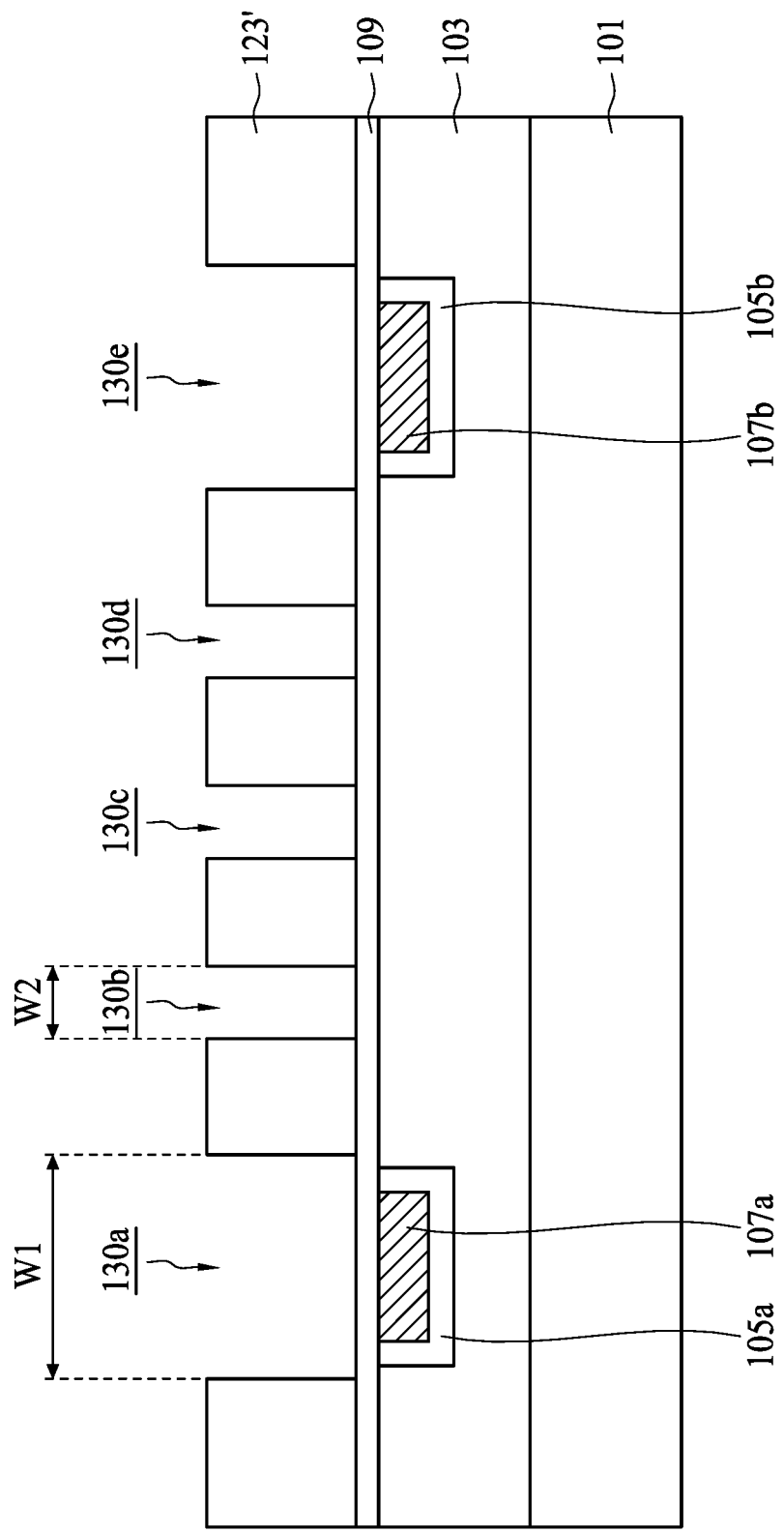
FIG. 9 is a cross-sectional view illustrating an intermediate stage of removing the photoresist pattern structure during the formation of the semiconductor device, in accordance with some embodiments.

Next, the photoresist pattern structure 111' is removed to form openings 130a, 130b, 130c, 130d and 130e in the dielectric layer 123', as shown in FIG. 9 in accordance with some embodiments. In some embodiments, the photoresist pattern structure 111' is removed using a stripping process or an ashing process. In some other embodiments, an etching process is used to remove the photoresist pattern structure 111'. The etching process may include a wet etching process, a dry etching process, or a combination thereof. The respective step is illustrated as the step S17 in the method 10 shown in FIG. 2.

The conductive pads 107a, 107b may be protected by the dielectric lining layer 109 during the removal of the photoresist pattern structure 111'. In addition, the openings 130a, 130e overlap the conductive pads 107a, 107b, and the openings 130b, 130c, 130d are formed without overlapping the conductive pads 107a, 107b. It should be noted that the widths of the openings 130a, 130e are greater than the widths of the openings 130b, 130c, 130d, in accordance with some embodiments. For example, the opening 130a has a width W1, the opening 130b has a width W2, and the width W1 is greater than the width W2.

Figure 10:
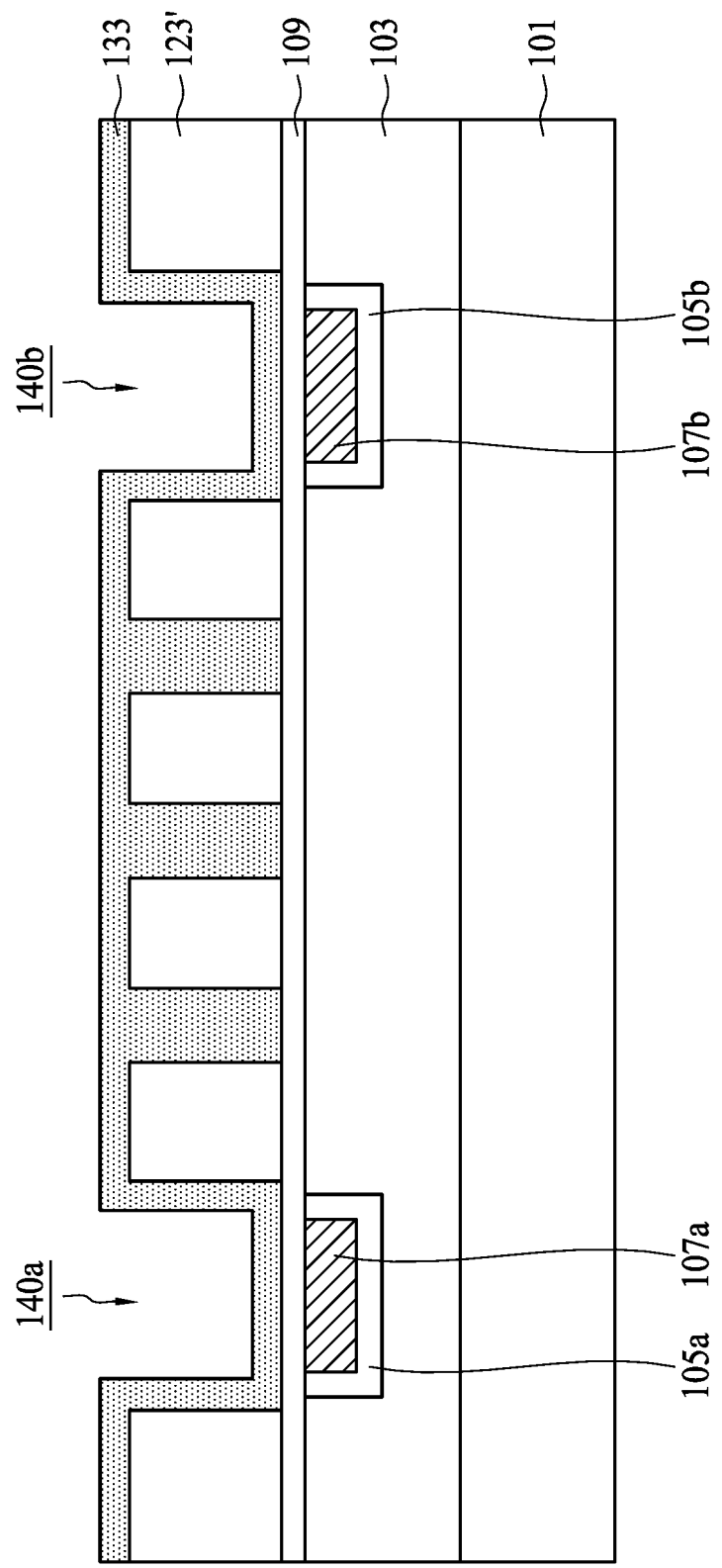
FIG. 10 is a cross-sectional view illustrating an intermediate stage of forming a dielectric layer during the formation of the semiconductor device, in accordance with some embodiments.

After the photoresist pattern structure 111' is removed, a dielectric layer 133 is formed over the dielectric layer 123' and the dielectric lining layer 109, as shown in FIG. 10 in accordance with some embodiments. The dielectric layer 133 is conformally deposited over sidewalls and bottoms of the openings 130a, 130b, 130c, 130d, 130e (see FIG. 9). Loading effect may occur during the deposition process. As a result, the openings 130a, 130e (with greater widths) are partially filled by the dielectric layer 133, while the openings 130b, 130c, 130d (with smaller widths) are entirely filled by the dielectric layer 133, and portions of the openings 130a, 130e remain as openings 140a, 140b after the deposition process.

In some embodiments, the dielectric layer 133 is made of a low dielectric constant (low-k) material (e.g., k<5), such as silicon oxide, silicon oxynitride, silicon nitride, silicon carbide, silicon carbonitride, carbon-doped silicon oxide, fluorinated silica glass (FSG), amorphous fluorinated carbon, parylene, bis-benzocyclobutenes (BCB), polyimide, another suitable material, or a combination thereof. In some embodiments, the dielectric layer 133 and the dielectric lining layer 109 are made of different materials. Moreover, in some embodiments, the dielectric layer 133 and the dielectric layer 123' are made of different materials. The dielectric layer 133 may be deposited using a CVD process, a PVD process, a spin-coating process, another suitable process, or a combination thereof.

Figure 11:
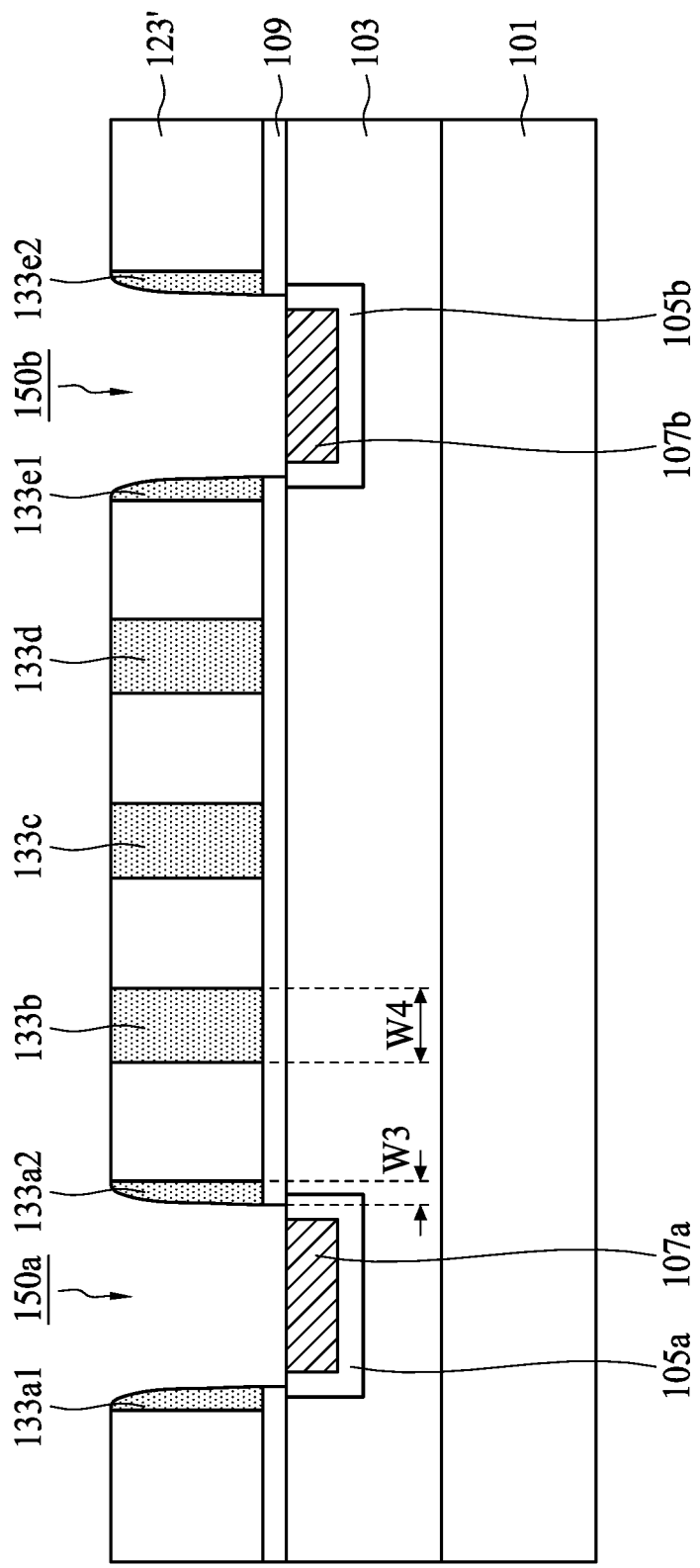
FIG. 11 is a cross-sectional view illustrating an intermediate stage of forming dielectric spacers and dielectric structures during the formation of the semiconductor device, in accordance with some embodiments.

Next, a first etching process, such as an anisotropic etching process, is performed to partially remove the dielectric layer 133, as shown in FIG. 11 in accordance with some embodiments. As a result, the dielectric spacers 133a1, 133a2, 133e1, 133e2 and the dielectric structures 133b, 133c, 133d are formed. The respective step is illustrated as the step S19 in the method 10 shown in FIG. 2.

The directional nature of the anisotropic etching process removes the same amount of the dielectric layer 133 vertically in all places, leaving the dielectric spacers 133a1, 133a2, 133e1, 133e2 over the sidewalls of the openings 130a, 130e (see FIG. 9). After the first etching process, the dielectric spacers 133a1 and 133a2 are separated by an opening 150a, and the dielectric spacers 133e1 and 133e2 are separated by another opening 150b. Moreover, the first etching process is a dry etching process, in accordance with some embodiments.

It should be noted that the widths of the dielectric structures 133b, 133c, 133d are greater than the widths of the dielectric spacers 133a1, 133a2, 133e1, 133e2, in accordance with some embodiments. For example, the dielectric spacer 133a2 has a width W3, the dielectric structure 133b has a width W4, and the width W4 is greater than the width W3.

Figure 12:
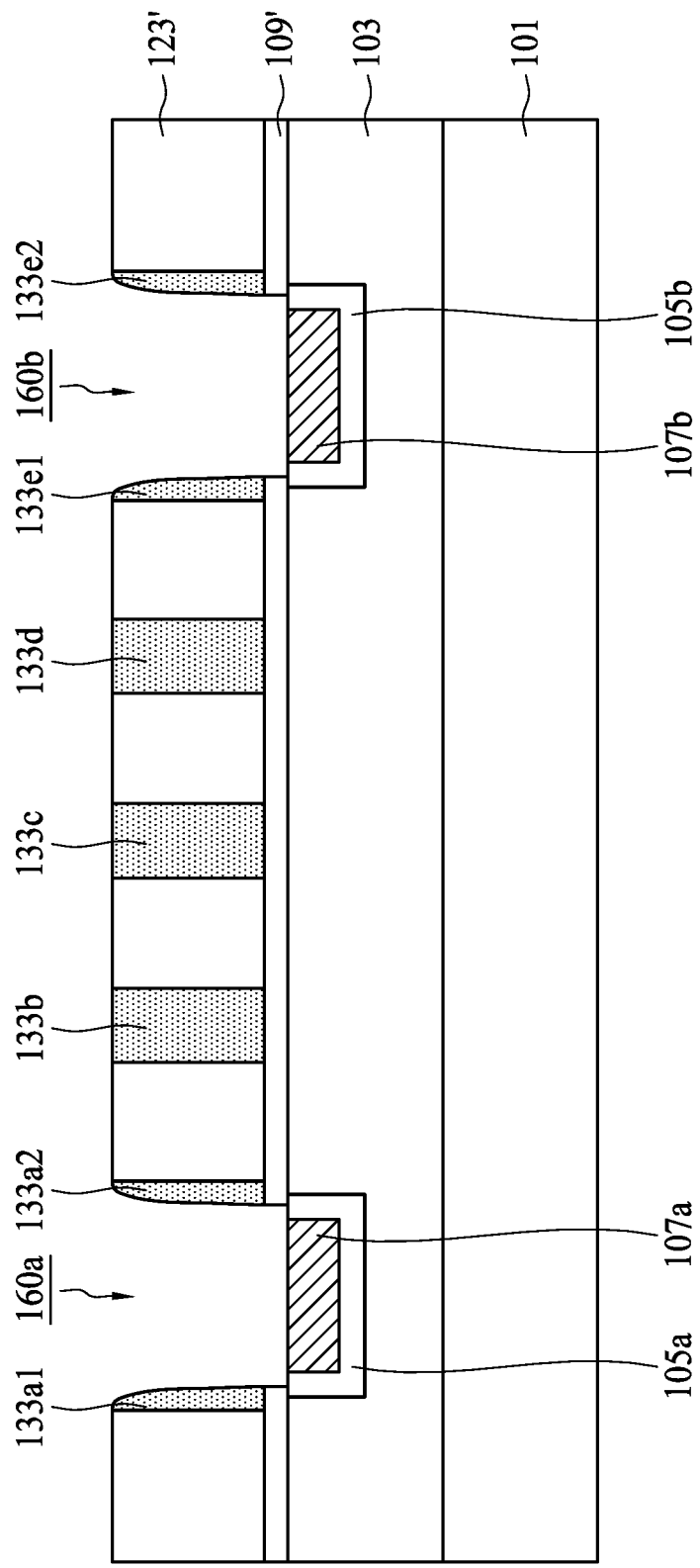
FIG. 12 is a cross-sectional view illustrating an intermediate stage of partially removing the dielectric lining layer during the formation of the semiconductor device, in accordance with some embodiments.

A second etching process, such as an anisotropic etching process, is performed to partially remove the dielectric lining layer 109 using the dielectric spacers 133a1, 133a2, 133e1, 133e2 as a mask, as shown in FIG. 12 in accordance with some embodiments. In some embodiments, the openings 150a, 150b are deepened to form openings 160a, 160b, and the conductive pads 107a, 107b are exposed by the openings 160a, 160b. The respective step is illustrated as the step S21 in the method 10 shown in FIG. 2.

In some embodiments, the second etching process is a dry etching process. It should be noted that the materials of the dielectric spacers 133a1, 133a2, 133e1, 133e2 and the dielectric layer 123' are different from the material of the dielectric lining layer 109, and the etchant of the second etching process is selected to have a high etching selectivity to the dielectric lining layer 109. In other words, an etching rate of the second etching process to the dielectric lining layer 109 is much higher than an etching rate of the second etching process to the dielectric spacers 133a1, 133a2, 133e1, 133e2, and the etching rate of the second etching process to the dielectric lining layer 109 is much higher than an etching rate of the second etching process to the dielectric layer 123'. Therefore, the second etching process is a self-aligned etching process. After the second etching process, the sidewalls of the etched dielectric lining layer 109' may be aligned with the lower portions of the sidewalls of the dielectric spacers 133a1, 133a2, 133e1, 133e2.

Figure 13:
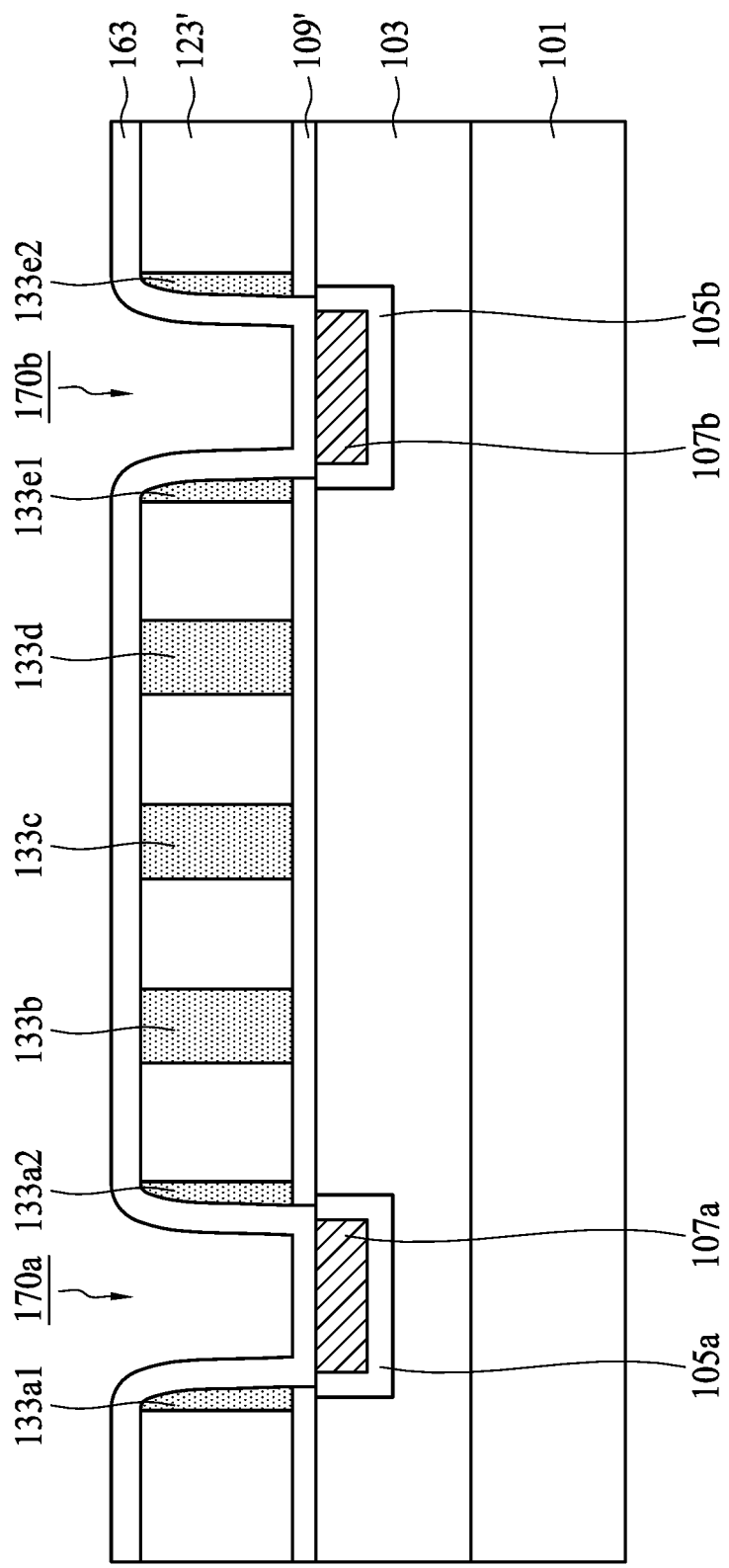
FIG. 13 is a cross-sectional view illustrating an intermediate stage of forming a conductive lining layer during the formation of the semiconductor device, in accordance with some embodiments.

After the conductive pads 107a, 107b are exposed, a conductive lining layer 163 is formed over the dielectric layer 123', the dielectric spacers 133a1, 133a2, 133e1, 133e2, the conductive pads 107a, 107b and the dielectric structures 133b, 133c, 133d, as shown in FIG. 13 in accordance with some embodiments. The conductive lining layer 163 is conformally deposited over sidewalls and bottoms of the openings 160a, 160b (see FIG. 12). More specifically, in some embodiments, the conductive lining layer 163 is in direct contact with the dielectric spacers 133a1, 133a2, 133e1, 133e2, the dielectric lining layer 109' and the conductive pads 107a, 107b.

The conductive lining layer 163 may be configured to separate the dielectric spacers 133a1, 133a2, 133e1, 133e2 from the subsequently-formed conductive layer. In addition, some materials and processes used to form the conductive lining layer 163 are similar to, or the same as, those used to form the conductive liners 105a, 105b, and details thereof are not repeated herein. After the conductive lining layer 163 is deposited, reduced openings 170a, 170b are obtained.

Figure 14:
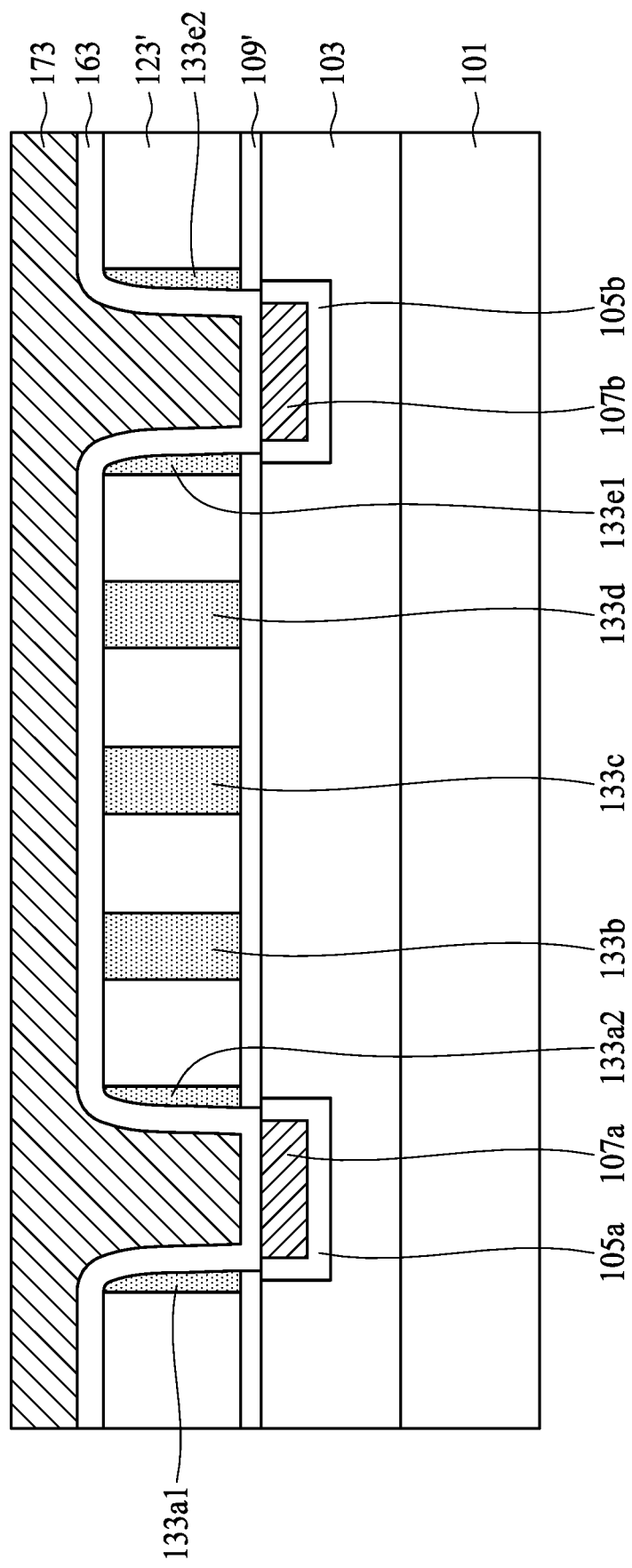
FIG. 14 is a cross-sectional view illustrating an intermediate stage of forming a conductive layer during the formation of the semiconductor device, in accordance with some embodiments.

Next, a conductive layer 173 is formed over the conductive lining layer 163, and the reduced openings 170a, 170b are filled by the conductive layer 173, as shown in FIG. 14 in accordance with some embodiments. In some embodiments, the conductive layer 173 is made of copper (Cu) or copper alloy. In some other embodiments, the conductive layer 173 is made of aluminum (Al), aluminum alloy, tungsten (W), tungsten alloy, titanium (Ti), titanium alloy, tantalum (Ta), tantalum alloy, another suitable conductive material, or a combination thereof. Moreover, the formation method of the conductive layer 173 may involve an electroplating process, an electroless plating process, a sputtering process, a PVD process, a CVD process, another suitable process, or a combination thereof.

Figure 15:
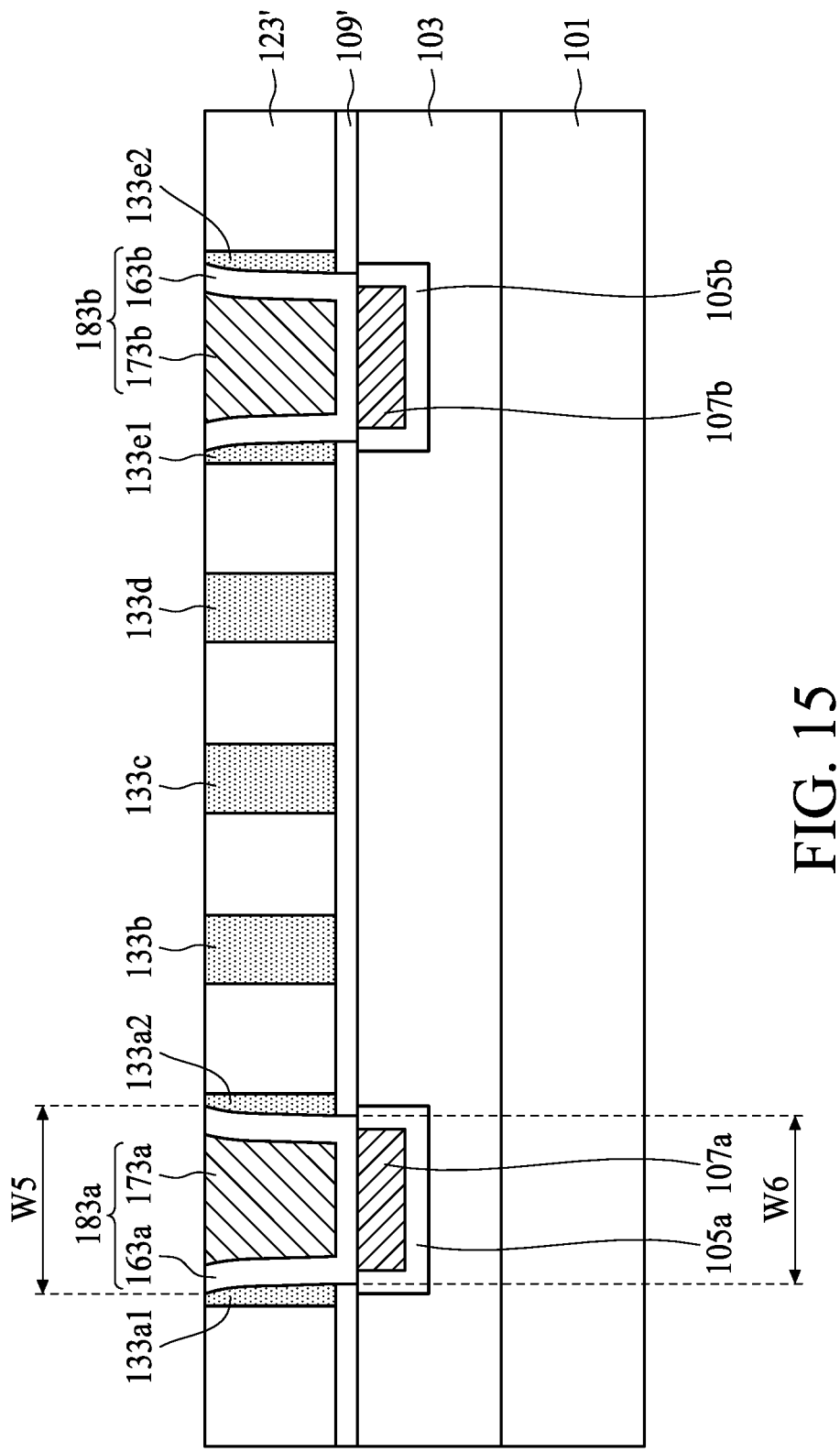
FIG. 15 is a cross-sectional view illustrating an intermediate stage of forming interconnect structures during the formation of the semiconductor device, in accordance with some embodiments.

After the conductive layer 173 is formed, a planarization process is performed to expose the dielectric layer 123', and the interconnect structures 183a, 183b are formed, as shown in FIG. 15 in accordance with some embodiments. In some embodiments, the dielectric spacers 133a1, 133a2, 133e1, 133e2 are exposed after the planarization process for forming the interconnect structures 183a, 183b. The respective step is illustrated as the step S23 in the method 10 shown in FIG. 2.

As mentioned above, the interconnect structure 183a includes the conductive liner 163a and the conductive structure 173a, and the interconnect structure 183b includes the conductive liner 163b and the conductive structure 173b. In particular, each of the interconnect structures 183a, 183b has a top width and a bottom width, and the top width is greater than the bottom width, in accordance with some embodiments. For example, the interconnect structure 183a has a top width W5 and a bottom width W6, and the top width W5 is greater than the bottom width W6.

Moreover, in some embodiments, the interconnect structures 183a, 183b have curved sidewalls. The planarization process for forming the interconnect structures 183a, 183b may include a CMP process, a grinding process, an etching process, another suitable process, or a combination thereof. After the planarization process, the top surfaces of the dielectric layer 123', the dielectric spacers 133a1, 133a2, 133e1, 133e2, the interconnect structures 183a, 183b and the dielectric structures 133b, 133c, 133d are substantially coplanar with each other, in accordance with some embodiments. Within the context of this disclosure, the word "substantially" means preferably at least 90%, more preferably 95%, even more preferably 98%, and most preferably 99%.

Figure 16:
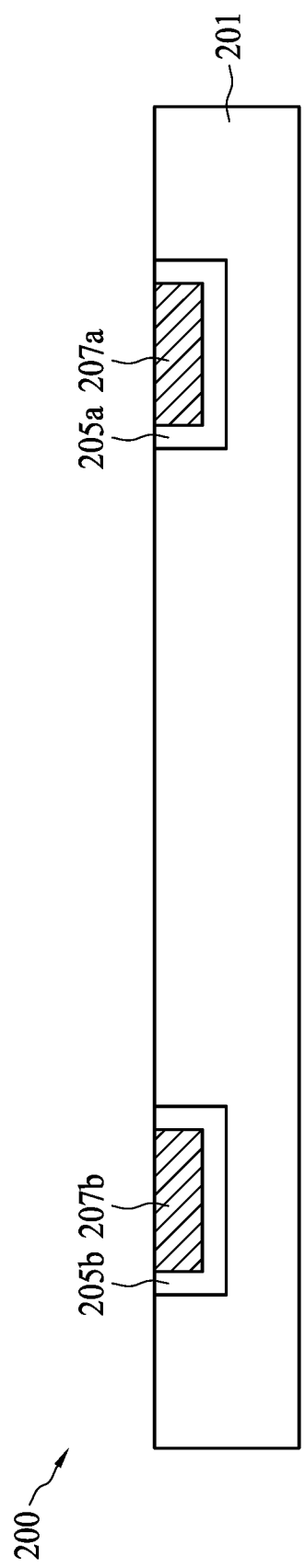
FIG. 16 is a cross-sectional view illustrating a second semiconductor die used to form the semiconductor device, in accordance with some embodiments.

As shown in FIG. 16, the second semiconductor die 200 is provided. As mentioned above, the second semiconductor die 200 includes the semiconductor substrate 201; and the conductive liners 205a, 205b and the conductive pads 207a, 207b in the semiconductor substrate 201. As with the semiconductor substrate 101 of the first semiconductor die 100, the semiconductor substrate 201 may be a portion of an IC chip that includes various passive and active microelectronic devices; however, descriptions of the devices are not repeated herein. In addition, some materials and processes used to form the conductive liners 205a, 205b and the conductive pads 207a, 207b are similar to, or the same as, those used to form the conductive liners 105a, 105b and the conductive pads 107a, 107b, and descriptions thereof are not repeated herein.

Figure 17:
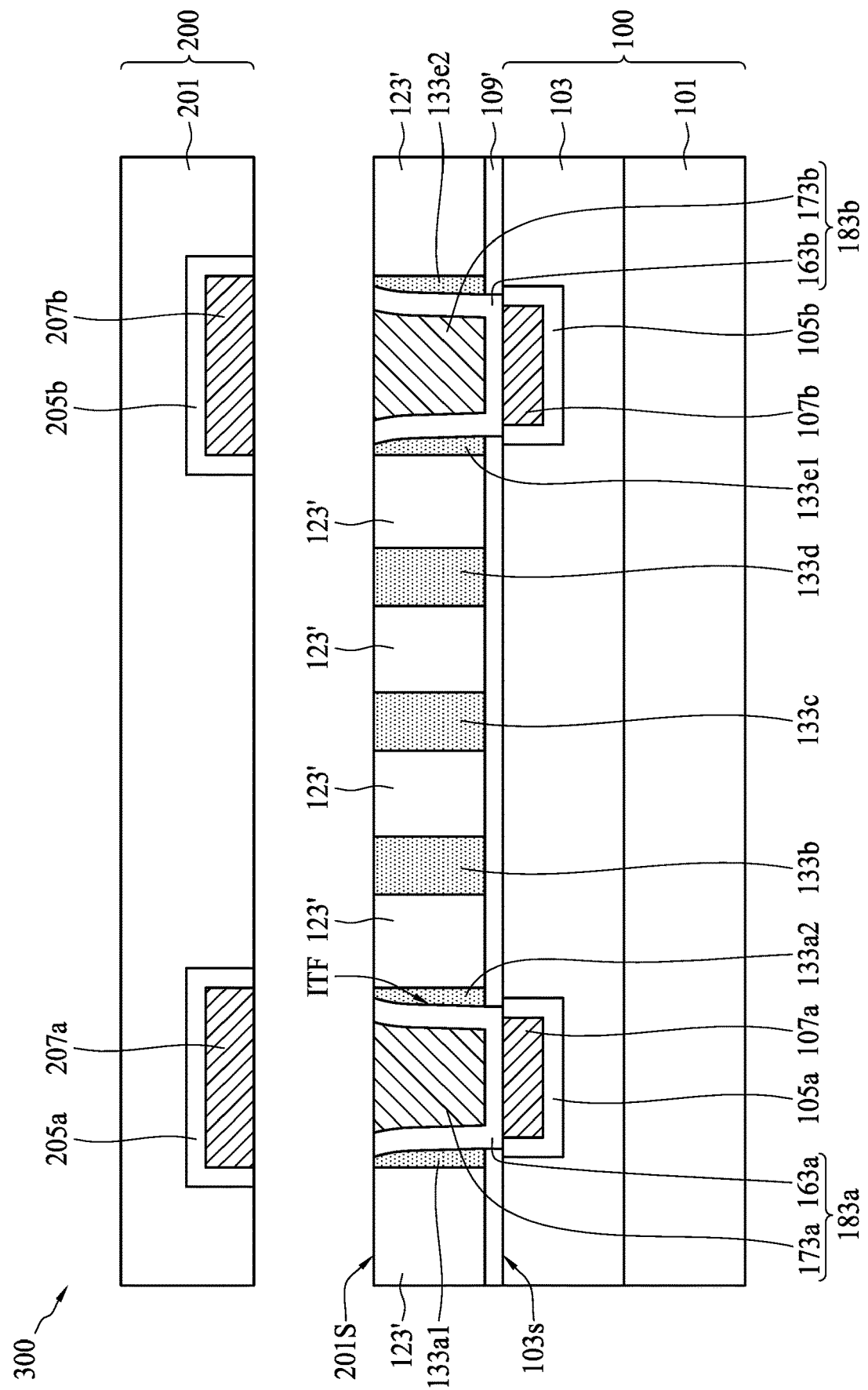
FIG. 17 is a cross-sectional view illustrating the bonding of the second semiconductor die to the first die to form the semiconductor device, in accordance with some embodiments.

Referring back to FIG. 17, the second semiconductor die 200 is flipped upside down and bonded to the dielectric layer 123' over the first semiconductor die 100, in accordance with some embodiments. It should be noted that the conductive pads 207a, 207b of the second semiconductor die 200 face the conductive pads 107a, 107b of the first semiconductor die 100. The respective step is illustrated as the step S25 in the method 10 shown in FIG. 2. After the bonding process, the semiconductor device 300 is obtained.

Examples of the semiconductor device 300 are provided in accordance with some embodiments of the disclosure. The semiconductor device 300 includes the dielectric spacers 133a1 and 133a2 surrounding the interconnect structure 183a, the dielectric spacers 133e1 and 133e2 surrounding the interconnect structure 183b, and the dielectric layer 123' surrounding the dielectric spacers 133a1, 133a2, 133e1 and 133e2. The dielectric spacers 133a1, 133a2, 133e1, 133e2 and the dielectric layer 123' form a composite dielectric structure, which has the advantages of reducing the parasitic capacitance and improving the performance of the semiconductor device 300.

In one embodiment of the present disclosure, a semiconductor device is provided. The semiconductor device includes an interconnect structure disposed over a first semiconductor die. The first semiconductor die includes a semiconductor substrate and a first conductive pad disposed over the semiconductor substrate, and the first conductive pad is covered by the interconnect structure. The semiconductor device also includes dielectric spacers surrounding the interconnect structure. An interface between the dielectric spacers and the interconnect structure is curved. The semiconductor device further includes a dielectric layer surrounding the dielectric spacers, and a second semiconductor die bonded to the dielectric layer and the interconnect structure. The second semiconductor die includes a second conductive pad, and the interconnect structure is covered by the second conductive pad.

In another embodiment of the present disclosure, a semiconductor device is provided. The semiconductor device includes a first dielectric layer disposed over a first semiconductor substrate, and a first conductive pad embedded in the first dielectric layer. The semiconductor device also includes a dielectric lining layer disposed over the first dielectric layer, and a second dielectric layer disposed over the dielectric lining layer. The semiconductor device further includes an interconnect structure penetrating through the second dielectric layer and the dielectric lining layer, and a dielectric spacer disposed between the interconnect structure and the second dielectric layer. In addition, the semiconductor device includes a second semiconductor substrate disposed over the second dielectric layer. A second conductive pad in the second semiconductor substrate is electrically connected to the first conductive pad through the interconnect structure.

In yet another embodiment of the present disclosure, a method for preparing a semiconductor device is provided. The method includes forming a photoresist pattern structure over a first semiconductor die. The first semiconductor die includes a first dielectric layer and a first conductive pad in the first dielectric layer, and the first conductive pad is covered by the photoresist pattern structure. The method also includes forming a second dielectric layer surrounding the photoresist pattern structure, and removing the photoresist pattern structure to form a first opening in the second dielectric layer. The method further includes forming dielectric spacers along sidewalls of the first opening, and forming an interconnect structure surrounded by the dielectric spacers. In addition, the method includes bonding a second semiconductor die to the second dielectric layer. The second semiconductor die includes a second conductive pad facing the interconnect structure, and the second conductive pad is electrically connected to the first conductive pad of the first semiconductor die through the interconnect structure.

Embodiments of a semiconductor device are provided in the disclosure. The semiconductor device includes dielectric spacers surrounding an interconnect structure, and a dielectric layer surrounding the dielectric spacers. The dielectric spacers and the dielectric layer form a composite dielectric structure to reduce the parasitic capacitance between the interconnect structure and other nearby interconnect structures and wiring.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method for preparing a semiconductor device, comprising:
    forming a photoresist pattern structure over a first semiconductor die, wherein the first semiconductor die comprises a first dielectric layer and a first conductive pad embedded in the first dielectric layer, and the first conductive pad is covered by the photoresist pattern structure;
    forming a second dielectric layer surrounding the photoresist pattern structure;
    removing the photoresist pattern structure to form a first opening in the second dielectric layer;
    forming dielectric spacers along sidewalls of the first opening;
    forming an interconnect structure surrounded by the dielectric spacers; and
    bonding a second semiconductor die to the second dielectric layer, wherein the second semiconductor die comprises a second conductive pad facing the interconnect structure, and the second conductive pad is electrically connected to the first conductive pad of the first semiconductor die through the interconnect structure.

2. The method for preparing a semiconductor device of claim 1, wherein the photoresist pattern structure comprises a first portion and a second portion, the first portion of the photoresist pattern structure is removed to form the first opening in the second dielectric layer, the second portion of the photoresist pattern structure is removed to form a second opening in the second dielectric layer, and a width of the first opening is greater than a width of the second opening.

3. The method for preparing a semiconductor device of claim 2, further comprising:
    depositing a third dielectric layer over the second dielectric layer after the photoresist pattern structure is removed, wherein the first opening is partially filled by the third dielectric layer while the second opening is entirely filled by the third dielectric layer.

4. The method for preparing a semiconductor device of claim 3, further comprising:
    performing a first dry etching process on the third dielectric layer such that the dielectric spacers are formed in the first opening, and the second opening is filled by a dielectric structure, wherein the dielectric structure is wider than each of the dielectric spacers.

5. The method for preparing a semiconductor device of claim 1, further comprising:
    forming a dielectric lining layer over the first dielectric layer before the photoresist pattern structure is formed, wherein the first conductive pad is covered by the dielectric lining layer.

6. The method for preparing a semiconductor device of claim 5, further comprising:
    performing a second dry etching process on the dielectric lining layer using the dielectric spacers as a mask, such that the first conductive pad is exposed in the first opening before the interconnect structure is formed.

7. The method for preparing a semiconductor device of claim 1, wherein the step of forming the interconnect structure comprises:
    forming a conductive lining layer over the second dielectric layer, the dielectric spacers and the first conductive pad;
    forming a conductive layer over the conductive lining layer; and
    polishing the conductive lining layer and the conductive layer to expose the second dielectric layer and the dielectric spacers.

* * * * *